United States Patent
Cheng et al.

[11] Patent Number: 5,558,528
[45] Date of Patent: Sep. 24, 1996

[54] CONNECTOR WITH EJECTOR

[75] Inventors: Lee-Ming Cheng, Cupertino; Edmond Choy, Union City, both of Calif.

[73] Assignee: Hon Hai Precision Ind. Co., Ltd., Taipei Hsien, Taiwan

[21] Appl. No.: 558,967

[22] Filed: Nov. 13, 1995

[51] Int. Cl.⁶ .................................................. H01R 13/62
[52] U.S. Cl. .................................... 439/160; 439/155
[58] Field of Search ...................... 439/152–160

[56] References Cited

U.S. PATENT DOCUMENTS

| | | | |
|---|---|---|---|
| 5,162,002 | 11/1992 | Regnier | 439/157 |
| 5,429,523 | 7/1995 | Tondreault | 439/160 |
| 5,443,394 | 8/1995 | Billman et al. | 439/157 |
| 5,445,531 | 8/1995 | Billman et al. | 439/160 |
| 5,470,242 | 11/1995 | Cheng et al. | 439/157 |

*Primary Examiner*—Neil Abrams
*Assistant Examiner*—Brian J. Biggi

[57] ABSTRACT

A card edge connector (10) includes an insulative housing (12) having a central lengthwise slot (14) for receiving a module (100) therein and a plurality of passageways (16) disposed by two sides of the slot (14) for receiving a corresponding number of contacts therein for mechanical and electrical engagement with the circuit pads printed on the bottom edge region of the module (100). A pair of guidable retention bars (18) integrally extend upward adjacent either end of the housing (12) wherein each guidable retention bar (18) includes a retention block (20) at the top. A rotatable ejector (40) is positioned at the outermost end beside the corresponding pair of guidance bars (18), and includes on the interior surface a guiding surface (32) which generally comprises three sections (34, 36, 38) wherein a first section (34) has an arch configuration with regard to the center of the spindle (41) of the ejector (40), the second section (36) has a straight line configuration which is substantially vertical to the housing (12) when the ejector (40) is in a closed state, and a third section (38) has an oblique or diverged configuration with regard to the second section (36), whereby the module (100) can be guidably loaded into the housing (12) in both lateral and lengthwise directions regardless of whether such ejector (40) is in a closed or open state.

14 Claims, 8 Drawing Sheets

CONNECTOR WITH EJECTOR

BACKGROUND OF THE INVENTION

1. Field of the Invention

The invention relates to card edge connectors, particularly to the connector having rotatable ejectors at lengthwise ends thereof for ejecting the module inserted therein.

2. The Prior Art

The card edge connector having at least a rotatable ejector adjacent one lengthwise end thereof for ejecting a module inserted therein, is disclosed in several U.S. patents, for example, U.S. Pat. Nos. 5,074,800, 5,167,517, 5,211,568 and 5,302,133, wherein the ejector for use with such connector generally itself includes an end wall and two side walls for latchably confining the inserted module therein in both lengthwise and lateral directions. Anyhow, using the structures of the rotative ejector most of time only can retain in position the module which has been completely received within the connector when such ejector is in a closed state for latching the module in the connector, but can not efficiently guide or align the module during insertion of the module into the connector when such ejector is in an open state, i.e., not in a closed state, for being ready to receive the module in the connector. Therefore, U.S. Pat. No. 5,470,242 ('242) having one same inventor with the present invention, discloses a card edge connector with an integral U-shaped section incorporating the ejector aside on either lengthwise end for guidable and latchable alignment with the module inserted therein. Though the structures disclosed in '242 may assure alignment of the module during insertion of the module into the connector, such structures of the connector housing and of the ejector may be deemed a little too complicated for manufacturing.

Therefore, an object of the invention is to provide a card edge connector with at least one ejector at one end with first means integrally extending upward from the housing for guidably retaining the inserted module in a lateral direction and second means formed on the ejector for guidably aligning the module in a lengthwise direction with regard to the connector.

SUMMARY OF THE INVENTION

According to an aspect of the invention, a card edge connector includes an insulative housing having a central lengthwise slot for receiving a module therein and a plurality of passageways disposed by two sides of the slot for receiving a corresponding number of contacts therein for mechanical and electrical engagement with the circuit pads printed on the bottom edge region of the module. A pair of guidance bars integrally extend upward adjacent either end of the housing wherein each guidance bar includes a retention block at the top. A rotatable ejector is positioned at the outermost end beside the corresponding pair of guidance bars, and includes on the interior side a guiding surface which generally comprises three sections wherein a first section has an arc configuration with regard to the center of the spindle of the ejector, the second section has a straight line configuration which is substantially vertical to the housing when the ejector is in a closed state, and a third section has an oblique or diverged configuration with regard to the second section, whereby the module can be guidably loaded into the housing in both lateral and lengthwise directions regardless of whether such ejector is in a closed or open state.

DETAILED DESCRIPTION OF THE PREFERRED EMBODIMENT

References will now be made in detail to the preferred embodiments of the invention. While the present invention has been described with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

It will be noted here that for a better understanding, most of like components are designated by like reference numerals throughout the various figures in the embodiments. Attention is now directed to FIGS. 1-4 wherein a card edge connector 10 includes an insulative elongated housing 12 with a central slot 14 therein for reception of a module 100 (FIGS. 5(A) and 5(B)) therein. A plurality of passageways 16 (only few shown) are disposed by two sides of the central slot 14 for receiving therein a plurality of contacts (not shown in this application but able to be referred to the aforementioned U.S. Pat. No. 5,470,242), wherein such contacts may project into the slot 14 for mechanical and electrical engagement with the circuit pads printed on the bottom edge region of the module 100.

A pair of guidable retention bars 18 integrally and independently extend upward adjacent either lengthwise end of the housing 12 and by two sides of the central slot 14. Each guidable retention bar 18 includes at the top a retention block 20 having a retention surface 22 and a guidable surface 24 thereon, (FIGS. 2 and 3).

Figure 1:
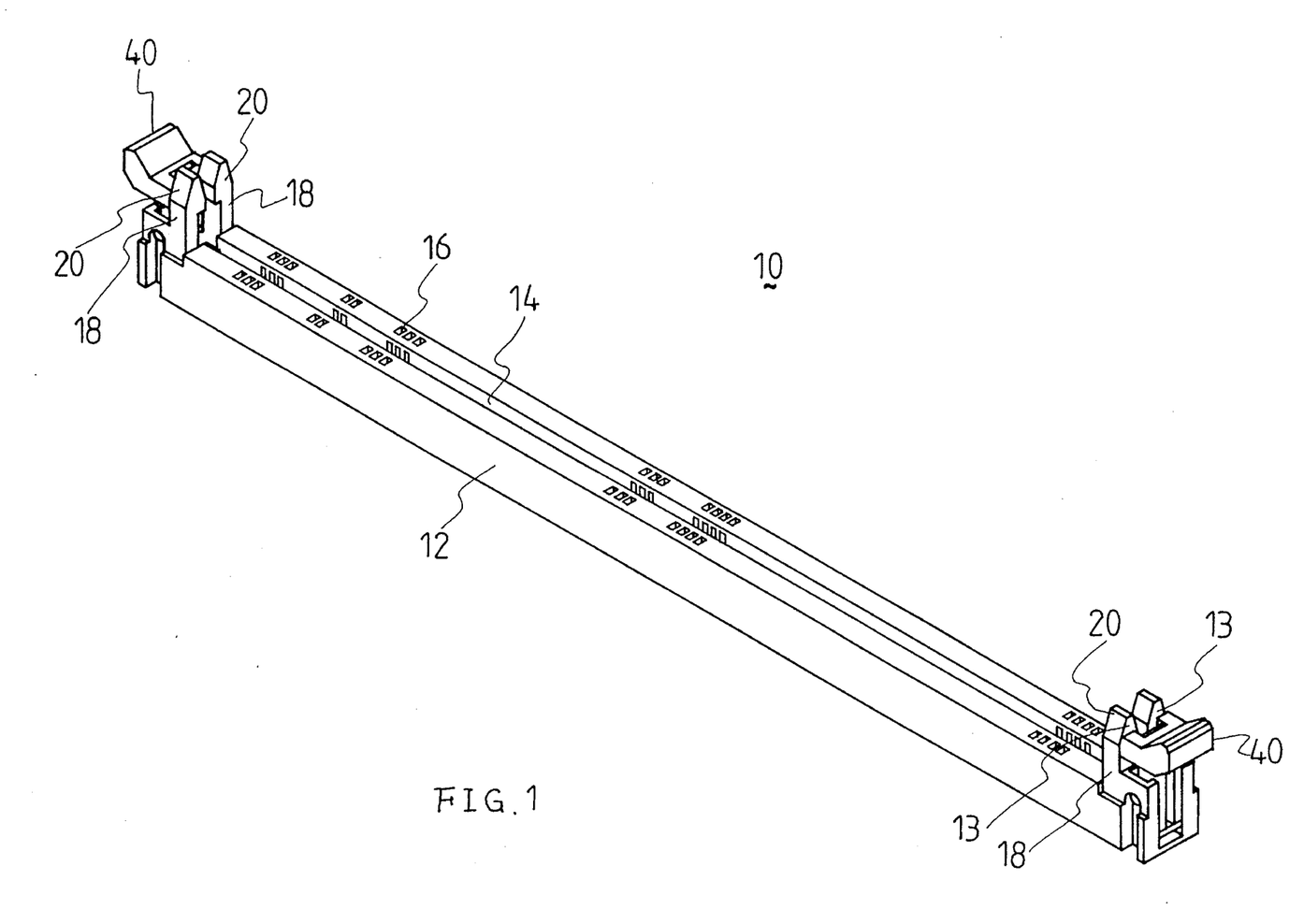
FIG. 1 is a perspective view of a presently preferred embodiment of a card edge connector without contacts therein according to the invention.
Figure 2:
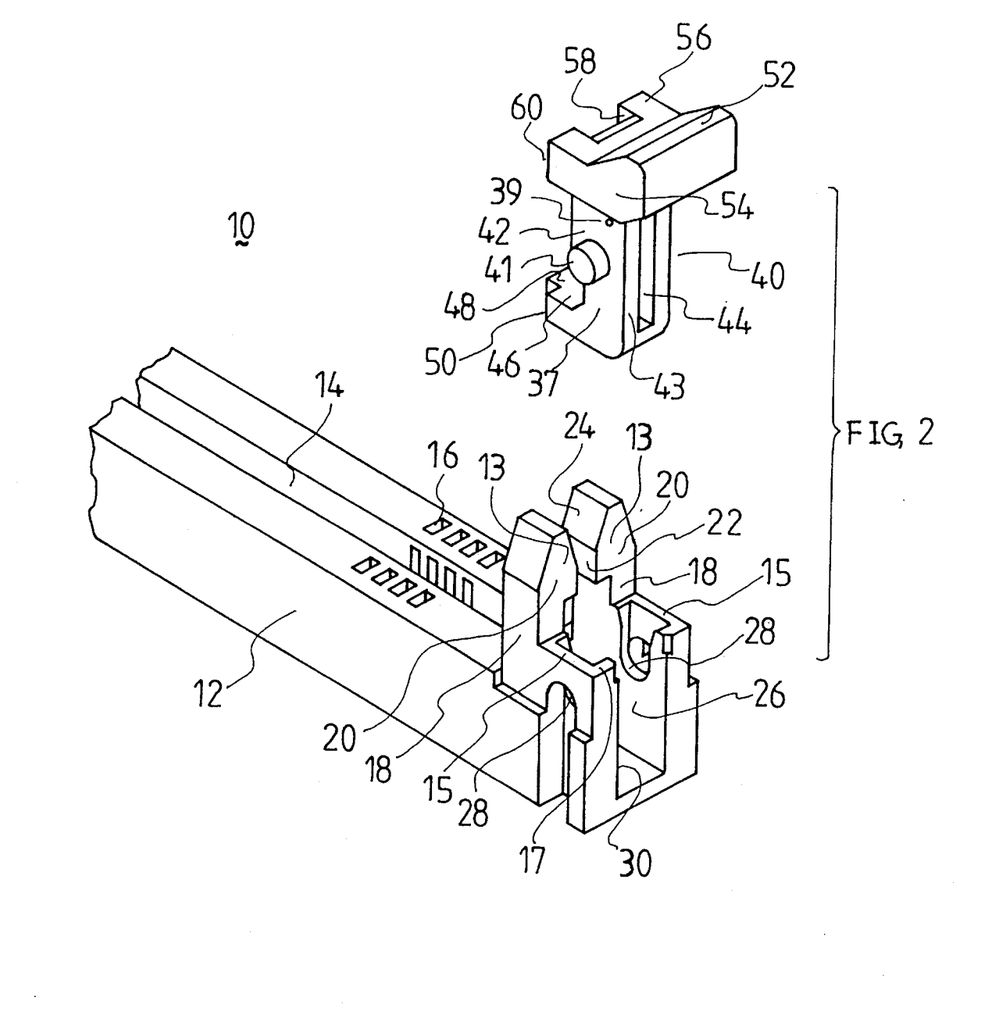
FIG. 2 is a fragmentary perspective view of the card edge connector of FIG. 1 with the ejector withdrawn therefrom to show the structural relationship between the housing and the ejector.
Figure 3:
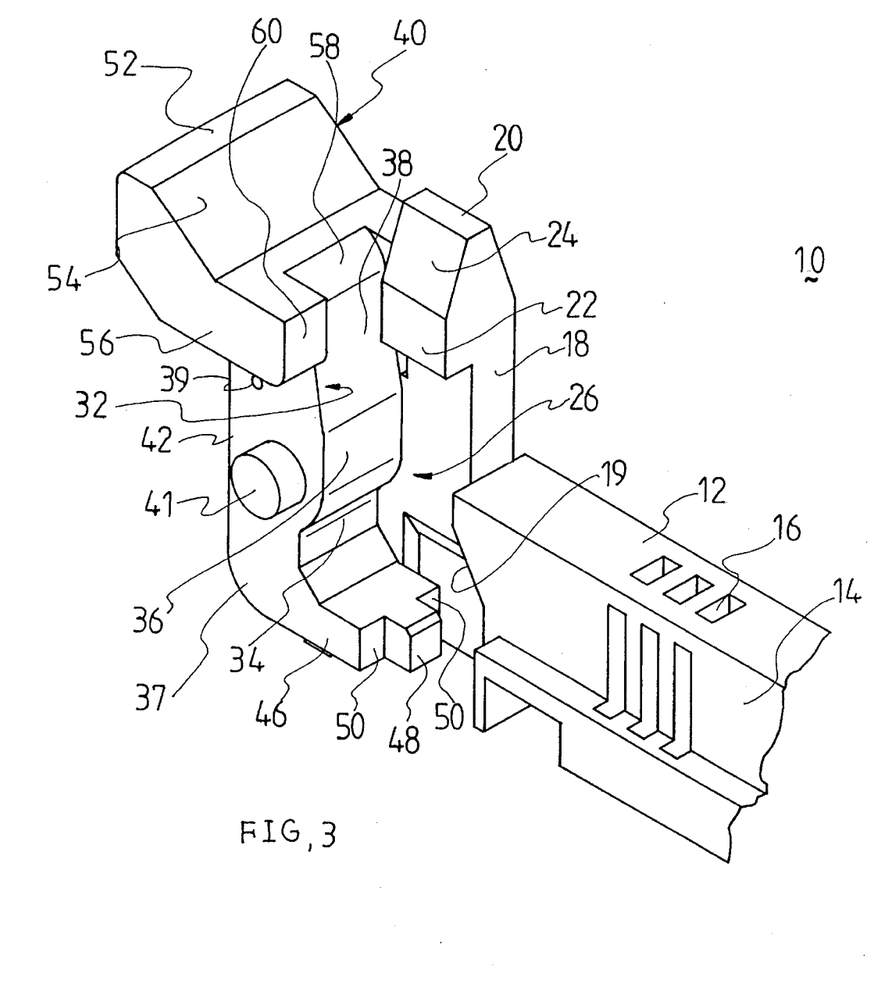
FIG. 3 is a fragmentary perspective view of the card edge connector of FIG. 1 with the housing being cut-away to show how the ejector is received within the housing when it is in a closed state.

Referring to FIGS. 2 and 3, the housing 12 includes a cavity 26 at the end beside the corresponding pair of guidable bars 18 for reception of a rotatable ejector 40 therein. A pair of holes 28 are formed respectively in two opposite side walls 15 of the housing 12, and an opening 30 is formed in the end wall 17 of the housing 12.

Figure 4:
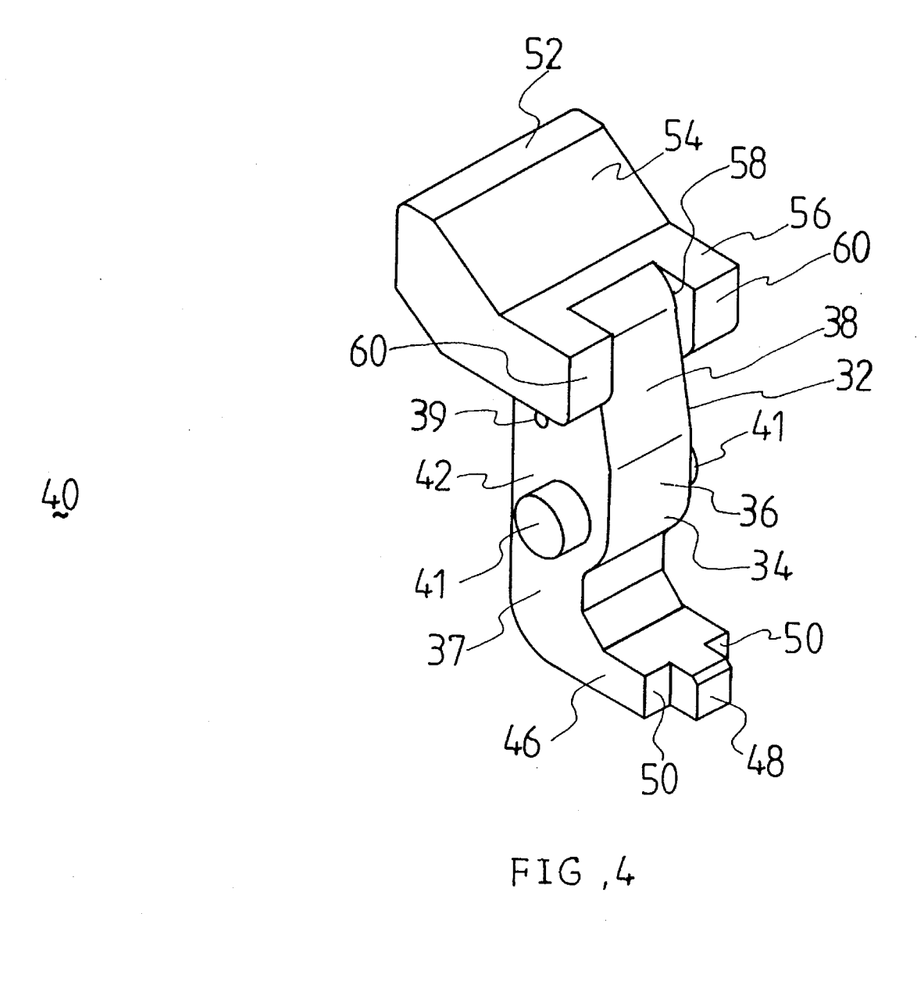
FIG. 4 is a perspective view of the ejector of the card edge connector of FIG. 1 to show the guiding surface thereof.

Referring to FIGS. 2, 3 and 4, the ejector 40 includes a main body 42 having therein a slit 44 extending from the exterior surface 43 into main body 42 for allowing inward deflection of the main body 42 during assembling the ejector 40 into the cavity 26 in the housing 12. A pair of spindle sections 41 are formed on two side surfaces 37 of the main body 42 for corporation with the corresponding holes 28 in the side walls 15 of the housing 12. A pair of bosses 39 are formed on two side surfaces 37 of the main body 42 above the spindle sections 41 for properly retaining the ejector 40 in the vertical closed state with regard to the housing 12. A guiding surface 32 is formed on the interior surface of the main body 42, and includes a lower first arc section 34, a middle second vertical section 36 and an upper third oblique section 38.

An base section 46 generally extends horizontally from the bottom of the main body 42, and includes an ejection leg 48 projecting forward a distance and having a dimension in compliance with the slot 14 for being adapted to be moveable within slot 14. A pair of stopper surfaces 50 are formed by two sides of the ejection leg 48 for engagement with the housing 12 which will be described in detail later.

An expanded lever section 52 is disposed on the top of the main body 42, and includes an upward slanting actuation section 54, which is generally offset to the main body 42 in the vertical direction, and a stabilization section 56, which is generally in alignment with the main body 42 vertically. A channel 58 is formed in the stabilization section 56 in alignment and compliance with the main body 42. A pair of stopper surfaces 60 are formed on two sides of channel 58.

Figure 5A:
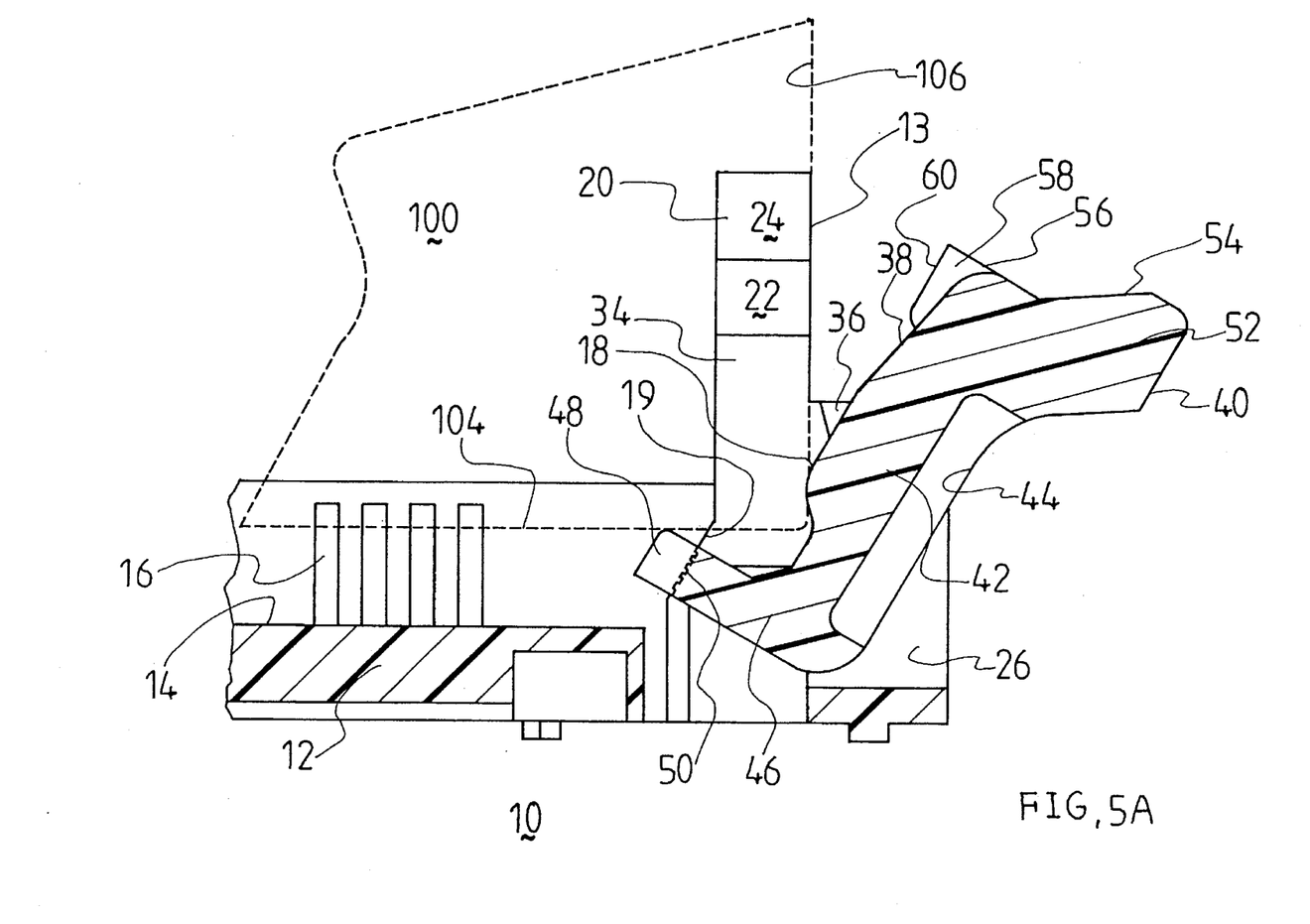
FIG. 5(A) is a cross-sectional view of the card edge connector of FIG. 1 to show the ejector is in an open state.
Figure 6A:
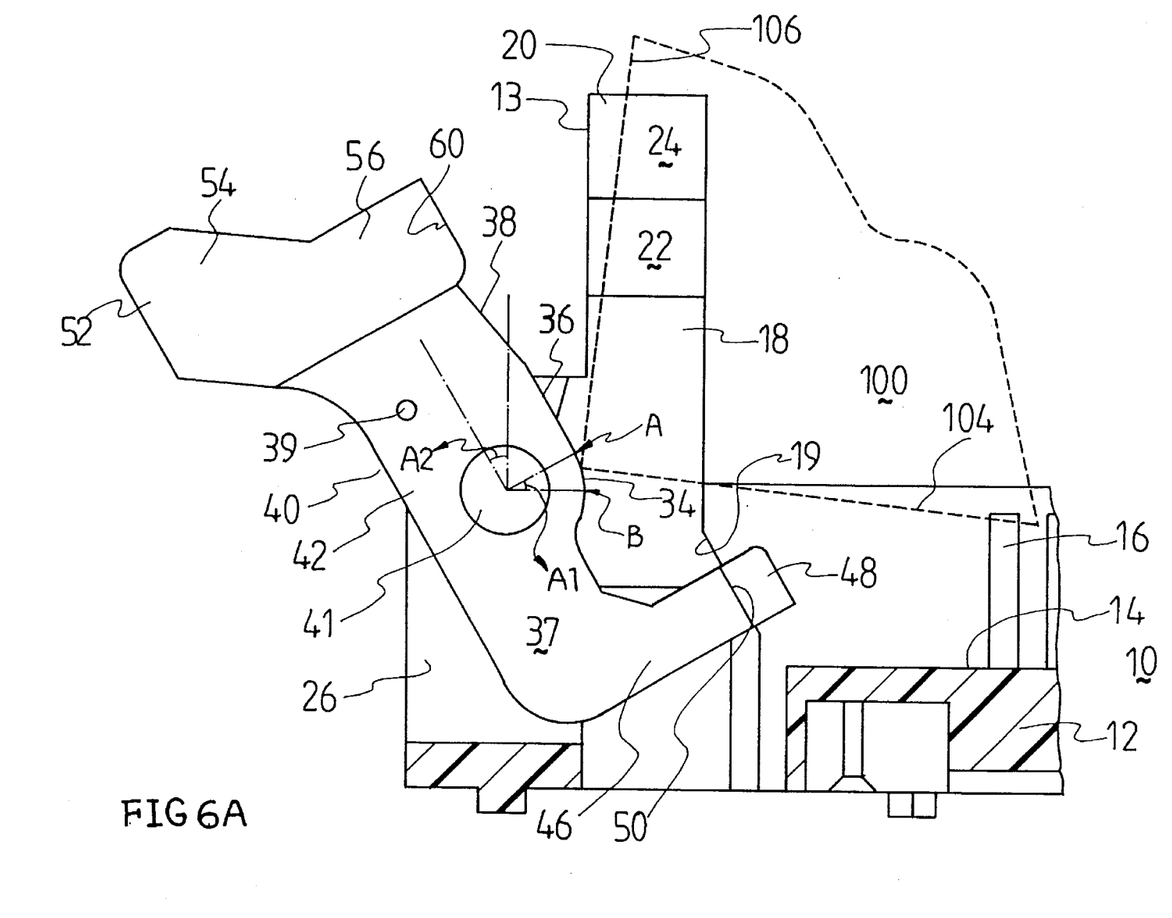
FIG. 6(A) is a cross-sectional view of the card edge connector of FIG. 1 with a non-cut ejector therein to show the relationship of the guiding surface of the ejector with regard to the spindle wherein the ejector is in an open state.

The ejectors 40 may be properly loaded into the corresponding cavities 26 in the housing 12, respectively, and are adapted to be rotated about the spindle sections 41 received within the corresponding holes 28 in the side walls 15 of the housing 12. The ejector 40 can be arranged in an open or oblique state as shown in FIGS. 5(A) and 6(A), wherein the lower stopper surfaces 50 (also FIG. 3) abut against the corresponding engagement surfaces 19 formed on the housing 12. This situation allows insertion of the module 100.

Figure 5B:
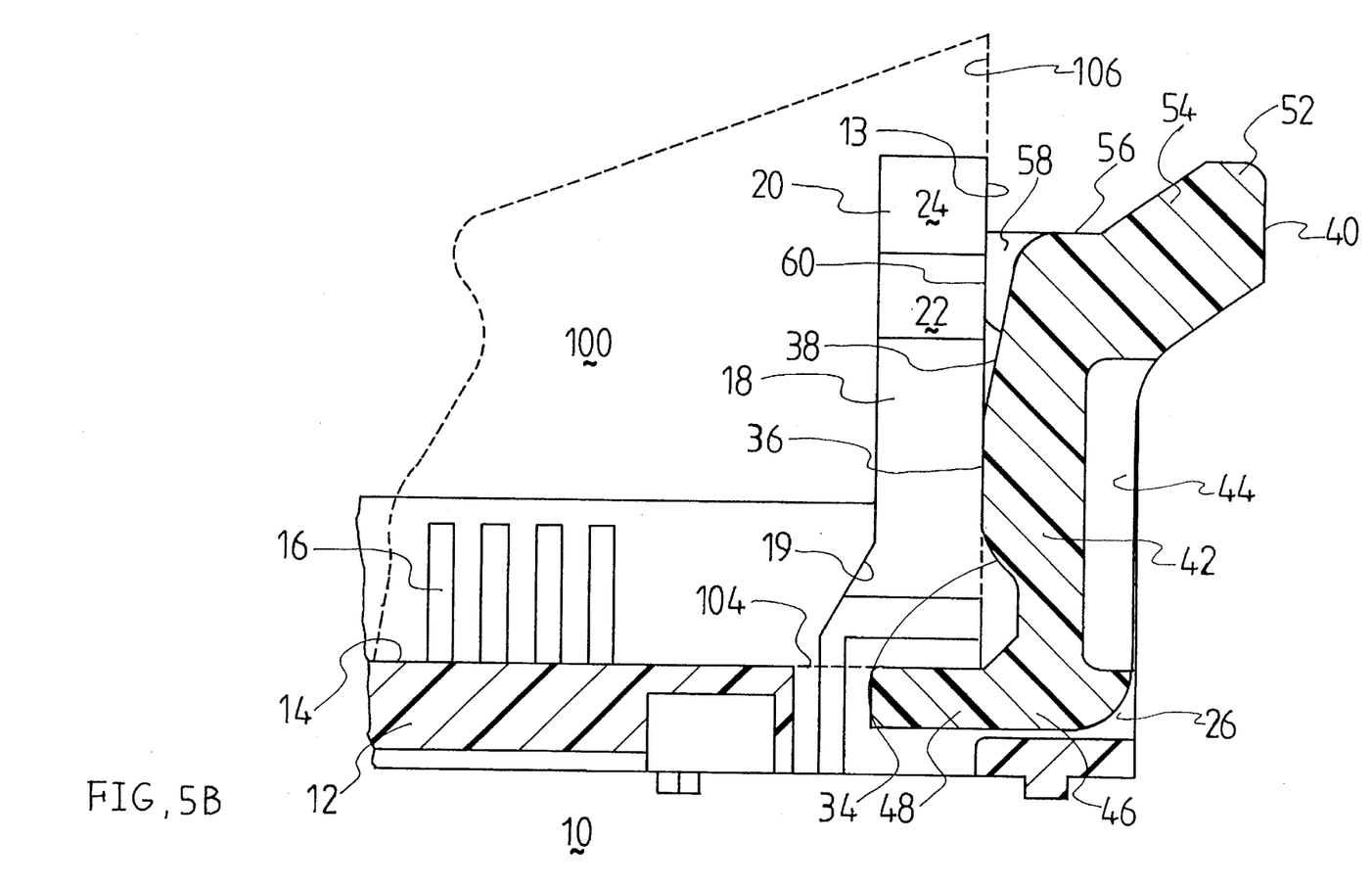
FIG. 5(B) is a cross-sectional view of the card edge connector of FIG. 1 to show the ejector is in a closed state.

Oppositely, FIG. 5(B) shows the ejector 40 is arranged in a closed or vertical state wherein the bottom edge 104 of the module 100 is seated on the base section 46 of the ejector 40 and the side edge 106 confronts the second vertical section 36 of the main body 42 of the ejector 40 so that the inserted module 100 is restrained, in the lengthwise direction, in the slot 14 by means of the confrontation of the module 100 against the vertical sections 36 of the main bodies 42 of the two ejectors 40 at two opposite lengthwise ends. Understandably, the retention blocks 20 of two pairs of guidable retention bars 18 may also sandwich the inserted module 100 therebetween wherein the engagement surfaces 22 butt the surfaces of the module 100, so that such module 100 is also restrained within the slot 14 in the connector 10 for the lateral direction. Under this situation, the upper stopper surfaces 60 abut against the side surfaces 13 of the corresponding guidable retention bars 18, respectively, for preventing further inward rotative movement of the ejector 40 with regard to the housing 12. Moreover, the bosses 39 on two side surfaces 37 of the main body 42 may engage the end wall 17 for properly retaining such ejector 40 in its vertical closed state.

The module 100 can be removed from the housing 12 of the connector 10 by downward pressing the actuation section 54 of the lever section 52. Thus, the ejector 40 can be outward rotated about the spindle section 41 and the ejection leg 48 of the ejector 40 is upward moved to push the module 100 to move upward and eventually get out of the housing 12 of the connector 10.

The feature of the invention includes the guiding surface 32 provided on the interior surface of the ejector 40 for allowing guidable insertion of the module 100 in the lengthwise direction regardless of whether the ejector 40 is in an oblique open state or a vertical closed state. As shown in FIG. 5(A) and 6(A) when the ejector 40 is in an open state, the arc section 34 may substantially confine the inserted module 100, in the lengthwise direction, in the initial stage of such insertion through the engagement of the side edges 106 of the module 100 with the arc sections 34 of the two opposite ejectors 42 at both ends. Successively, through the bottom edge 104 of the module 100 pushing the base sections 46 of the ejector 40 and the incurred following continuous rotation of the ejector 40, portions of the whole arc section 34 of the guiding surface 32 may continuously in turn engage the side edge 106 of the module 100 for continuously guiding the inserted module 100 into the slot 14 until the ejector 40 is rotated to his final vertical position wherein the bottom edge 104 of the module 100 is fully seated onto the base section 46 of the ejector 42 and the side edges 106 of the module 100 are respectively engaged with the corresponding vertical sections 36 of the ejectors 40, as shown in FIG. 5(B).

In FIG. 6(A), it is also noted that even though in the beginning of the insertion of the module 100, the module 100 is inserted in an oblique deviated position, the arc section 34 and the vertical section 36 which is now presented in a sloped manner, also can properly guide the side edge 106 of the module 100 to its right place, i.e., the position generally vertical to the housing 12, for having the ejector 40 rotated back to the vertical position.

Figure 6B:
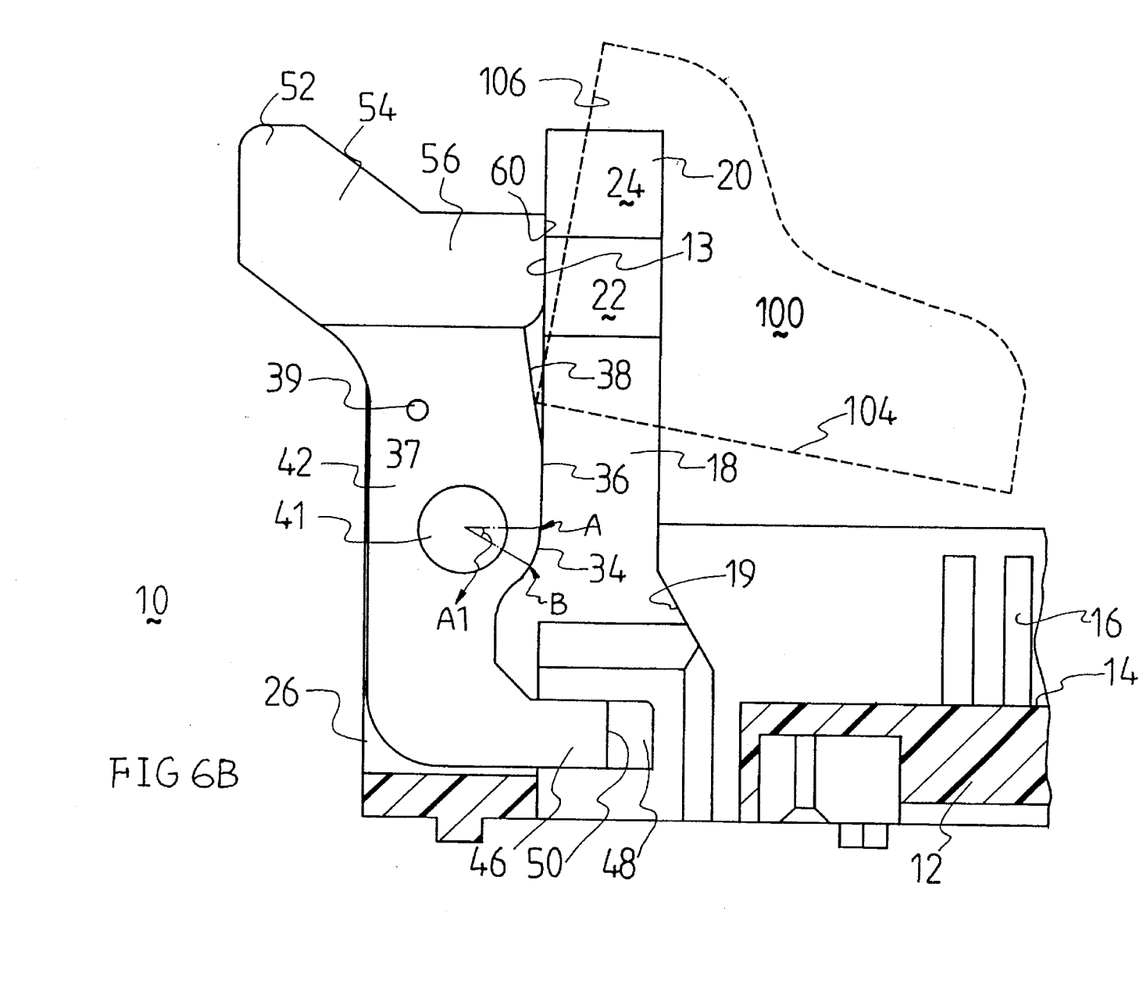
FIG. 6(B) is a cross-sectional view of the card edge connector of FIG. 1 with a non-cut ejector therein to show the relationship of the guiding surface of the ejector with regard to the spindle wherein the ejector is in a closed state.

It is also contemplated that even though the ejector 40 is in a closed state with regard to the housing 12 as shown in FIG. 5(B), the module 100 can still be easily and accurately inserted into the slot 14 with alignment in the lengthwise direction. In this situation, the side edge 106 of the module 100 is properly directly confined by the corresponding vertical section 34 of the ejector 40 in the lengthwise direction. Differently, as shown in FIG. 6(B), even though there is a deviation of the insertion of the module 100 in the lengthwise direction in the initial stage of such insertion, the upper oblique section 38 can properly guidably lead the side edge of the module 100 to successively engage the vertical section 36 of the ejector 40, thus eventually resulting in correct alignment of the module 100 with regard to the housing 12 in the lengthwise direction.

To achieve the designed purpose, the structural relationship between the guiding surface 32 and the spindle 41 should be paid attention to. In this embodiment, as shown in FIGS. 6 (A) and 6(B), the arc section 34 of the guiding surface 32 may be optimally arranged starting at a horizontal first position A with regard to the center point of the spindle 41 when the ejector 40 is in a vertical state as shown in FIG. 6(B), and terminating at a second position B below where the intersection angle A1 formed between the corresponding two radii is generally equal to or larger than the rotation angle A2 of the ejector 40 for avoiding any interference between the inserted module 100 and the arc section 34. Correspondingly, the middle section 36 of the guiding surface 32 vertically extend upward from position A and the oblique section 38 is successively arranged above the middle vertical section 36.

Another feature of the invention is that the guidable retention bars 18 having guidance/retention means, i.e., the retention block 20, in the lateral direction, which provides not only the retention function through the retention surfaces 22 for retaining the module 100 in the slot 14 of the connector 10, but also the guidance function through the guidable surfaces 24 for guiding the insertion of the module 100.

In conclusion, the present invention discloses a card edge connector with integral guidable retention bars and separate ejectors at the ends for provision of both lengthwise and lateral guiding and retaining functions regardless of whether the ejectors are in an oblique open or a vertical closed state. In contrast, most prior art card edge connectors with the associated ejectors can not fully or reliably comply with these multiple requirements. Additionally, the invention also provides a simplified and easy structure for manufacturing and assembling.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, persons of ordinary skill in this field are to understand that all such equivalent structures are to be included within the scope of the following claims.

We claim:

1. A card edge connector with a rotatable ejector for receiving a module therein, comprising:

an insulative elongated housing having a central slot for receiving said module therein;

a plurality of passageways disposed by at least one side of the slot for receiving a corresponding number of contacts therein;

first guidance/retention means integrally extending upward from the housing for laterally retaining and aligning the inserted module in the housing; and said ejector including second guidance/retention means having a guiding surface in an interior surface for retaining and aligning the inserted module lengthwise in the housing; wherein said guiding surface includes a lower arc section, a middle vertical section and an upper oblique section.

2. The connector as described in claim 1, wherein said first guidance/retention means includes at least a pair of opposite guidable retention bars adjacent one end of the housing, and each bars includes a retention block having a retention surface and a guidable surface thereon.

3. The connector as described in claim 1, wherein said lower arc section starts at a horizontal first position with regard to a spindle of said ejector when said ejector is in a vertical closed state and terminates at a second position below the first position, and wherein an intersection angle between two radii of said first point and of said second radii to a center point of said spindle is no less than a maximum rotation angle of said ejector.

4. The connector as described in claim 1, wherein said ejector further includes a base having ejection leg for engagement with a bottom edge of the module, and at least a lower stopper surface for engagement with the housing for limiting the outward rotation of the ejector.

5. The connector as described in claim 1, wherein said ejector further includes an expanded lever section having stabilization section with at least an upper stopper surface thereon for engagement with the corresponding first guiding/retention means for limiting inward rotation of the ejector.

6. An ejector for use with a card edge connector, comprising:

a main body, a base on a bottom portion and a lever section on a top portion; wherein said main body including a guiding surface on an interior surface, said guiding surface including a lower arc section, a middle vertical section and an upper oblique section to meet the requirements that a module can be inserted into the connector regardless of whether the ejector is in an oblique open or a vertical closed position.

7. The ejector as described in claim 6, wherein said base further includes an ejection leg and at least a lower stopper surface for limiting outward rotation of the ejector with regard to the connector.

8. The ejector as described in claim 6, wherein said lever section includes an actuation section generally offset from the main body in a vertical direction and a stabilization section generally in alignment with the main body in the vertical direction, and wherein said stabilization section includes at least an upper stopper surface for limiting inward rotation of the ejector with regard to the connector.

9. The ejector as described in claim 6, wherein said main body further includes at least a spindle on a side surface whereby said arc section starts at a first point which is generally in a horizontal position with regard to a center of said spindle when said ejector is in a vertical state with regard to the connector, and terminates a second point below said first point, and an includes angle between said first point and said second point to the center of spindle is not less than a maximum rotation angle of the ejector within the connector.

10. A card edge connector with a rotatable ejector for receiving a module therein, comprising:

an insulative elongated housing having a central slot for receiving said module therein;

a plurality of passageways disposed by at least one side of the slot for receiving a corresponding number of contacts therein; the improvement including:

said ejector including guidance/retention means having guiding surface on an interior surface for lengthwise not only guidably aligning the inserted module during insertion of the module, but also properly retaining the inserted module in the housing after said module is completely received within the connector, wherein guidably aligning and properly retaining the module are implemented in both states that said ejector is obliquely open and said ejector is vertically closed.

11. The connector as described in claim 10, wherein said guiding surface includes a lower arc section, a middle vertical section and an upper oblique section.

12. The connector as described in claim 10, wherein said connector further includes at least a pair of retention bars integrally extending upward from the housing for laterally engaging the inserted module therebetween.

13. The connector as described in claim 12, wherein said ejector further includes stopper means for engagement with at least one of said bars for limiting inward rotation of the ejector.

14. The connector as described in claim 10, wherein said ejector includes on a top portion an expanded lever section having stabilization section substantially positioned above side walls of the housing.

* * * * *